US009448014B2

(12) United States Patent
Tsubokawa et al.

(10) Patent No.: US 9,448,014 B2
(45) Date of Patent: Sep. 20, 2016

(54) CHANNEL MEMBER, AND HEAT EXCHANGER, SEMICONDUCTOR UNIT, AND SEMICONDUCTOR MANUFACTURING APPARATUS INCLUDING THE SAME

(71) Applicant: KYOCERA Corporation, Kyoto-shi, Kyoto (JP)

(72) Inventors: Kenji Tsubokawa, Satsumasendai (JP); Kazuhiko Fujio, Satsumasendai (JP); Kenjiro Maeda, Satsumasendai (JP); Hiroyuki Abe, Satsumasendai (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 45 days.

(21) Appl. No.: 14/353,514

(22) PCT Filed: Oct. 29, 2012

(86) PCT No.: PCT/JP2012/077925
§ 371 (c)(1),
(2) Date: Apr. 23, 2014

(87) PCT Pub. No.: WO2013/062131
PCT Pub. Date: May 2, 2013

(65) Prior Publication Data
US 2014/0319672 A1    Oct. 30, 2014

(30) Foreign Application Priority Data

Oct. 28, 2011 (JP) .................................. 2011-237447

(51) Int. Cl.
*H01L 23/367* (2006.01)
*H01L 23/373* (2006.01)
(Continued)

(52) U.S. Cl.
CPC ................. *F28F 3/12* (2013.01); *F28F 13/12* (2013.01); *F28F 21/04* (2013.01);
(Continued)

(58) Field of Classification Search
CPC ............... H01L 23/473; H01L 23/367; H01L 23/3735; H01L 21/4882; H01L 23/3731; F28F 3/12
USPC ................................................... 257/714, 721
See application file for complete search history.

(56) References Cited

U.S. PATENT DOCUMENTS

| 4,814,030 A | 3/1989 | Dubuisson et al. |
| 4,859,520 A | 8/1989 | Dubuisson et al. |

(Continued)

FOREIGN PATENT DOCUMENTS

| DE | 3605554 A1 * | 8/1987 | ........... H01L 23/473 |
| EP | 0194216 A1 | 9/1986 | |

(Continued)

OTHER PUBLICATIONS

English language abstract of JP6268127A dated Sep. 22, 1994.

(Continued)

*Primary Examiner* — Marcos D Pizarro

(57) ABSTRACT

Channel members 100 to 107 according to the present invention have an inner spiral channel 9 through which a fluid 23 flows. The channel 9 is formed by a lid part 1, a bottom plate part 3, and a wall part 2 connected to the lid part 1 and the bottom plate part 3. The wall part 2 is made of a ceramic laminate. Even if the wall part 2 of the channel members 100 to 107 is narrow between channel segments 9, its good corrosion resistance allows the channel 9 to be resistant to collapse when the fluid 23 is supplied at high pressure. A heat exchanger 200, a semiconductor unit 300, and a semiconductor manufacturing apparatus 400 including any of the channel members 100 to 107 have improved heat exchange efficiency between the channel members 100 to 107 and the fluid 23.

14 Claims, 12 Drawing Sheets

(51) Int. Cl.
*H01L 23/473* (2006.01)
*F28F 3/12* (2006.01)
*H01L 21/67* (2006.01)
*H01L 21/48* (2006.01)
*F28F 13/12* (2006.01)
*F28F 21/04* (2006.01)
*H01J 37/32* (2006.01)

(52) U.S. Cl.
CPC .. *H01J 37/32715* (2013.01); *H01J 37/32724* (2013.01); *H01L 21/4882* (2013.01); *H01L 21/67109* (2013.01); *H01L 23/367* (2013.01); *H01L 23/473* (2013.01); *H01L 23/3731* (2013.01); *H01L 23/3735* (2013.01); *H01L 2924/0002* (2013.01)

(56) References Cited

U.S. PATENT DOCUMENTS 5,575,872 A * 11/1996 Tsukada et al. ........ B28B 1/002
156/182

2002/0031918 A1 * 3/2002 deRochemont et al. ..... 438/781
2010/0163210 A1 7/2010 Kluge

FOREIGN PATENT DOCUMENTS

| JP | 6268127 | A |   | 9/1994 |
| JP | 2001215093 | A | * | 8/2001 |
| JP | 2007184479 | A | * | 7/2007 |
| JP | 201062490 | A |   | 3/2010 |
| JP | 2010129673 | A |   | 6/2010 |
| JP | 2010526427 | A |   | 7/2010 |

OTHER PUBLICATIONS

English language abstract of JP2001215093A dated Aug. 10, 2001.
English language abstract of JP2010062490A dated Mar. 18, 2010.
English language abstract of JP2010129673A dated Jun. 10, 2010.
International Search Report issued in the corresponding PCT application No. PCT/JP2012/077925, dated Jan. 15, 2013, 4 pages.
Partial Search Report issued in the corresponding European Patent Application No. 12 843 158.2 dated Jun. 22, 2015, 7 pages.

* cited by examiner (a)

(b)

(c)

(a)

(b)

(c)

(a)

(b)

(a)

(b)

(c)

(a)

(b)

(a)

(b)

CHANNEL MEMBER, AND HEAT EXCHANGER, SEMICONDUCTOR UNIT, AND SEMICONDUCTOR MANUFACTURING APPARATUS INCLUDING THE SAME

TECHNICAL FIELD

The present invention relates to channel members and to heat exchangers, semiconductor units, and semiconductor manufacturing apparatuses including such channel members.

BACKGROUND ART

The trend toward smaller electronic components in recent years has resulted in higher packing densities and higher speeds of semiconductor devices mounted thereon. Accordingly, the amount of heat generated from semiconductor devices has increased, and electronic components have been used at higher temperatures. Thus, there is an increasing need to cool electronic components.

As an example of means for cooling electronic components, PTL 1 proposes a copper or aluminum channel member having a spiral channel and built into a power semiconductor device that reaches high temperature.

CITATION LIST

Patent Literature

PTL 1: Japanese Unexamined Patent Application Publication No. 6-268127

SUMMARY OF INVENTION

Technical Problem

However, because the channel member disclosed in PTL 1 is made of copper or aluminum, it has a problem in that the use of a fluid highly corrosive to metals, such as lithium bromide, results in corrosion of the wall surfaces of the channel and therefore results in collapse of the channel walls when the fluid is supplied at high pressure.

In view of the foregoing problem, an object of the present invention is to provide a channel member including channel walls resistant to corrosion and therefore resistant to collapse and a heat exchanger, semiconductor unit, and semiconductor manufacturing apparatus including such a channel member.

Solution to Problem

A channel member according to the present invention has an inner spiral channel through which a fluid flows. The channel is formed by a lid part, a bottom plate part, and a wall part connected to the lid part and the bottom plate part. The wall part is made of a ceramic laminate.

A heat exchanger according to the present invention includes the above channel member and a metal member on or in the lid part.

A semiconductor unit according to the present invention includes the above heat exchanger, with the metal member on the lid part, and a semiconductor device on the metal member.

A semiconductor manufacturing apparatus according to the present invention includes the above heat exchanger, and the metal member is an electrode that attracts a semiconductor wafer.

Advantageous Effects of Invention

The channel member according to the present invention has the inner spiral channel through which the fluid flows, the channel is formed by the lid part, the bottom plate part, and the wall part connected to the lid part and the bottom plate part, and the wall part is made of a ceramic laminate; thus, the channel walls are resistant to corrosion and are therefore resistant to collapse.

Because the heat exchanger according to the present invention includes the above channel member and the metal member on the lid part, the heat exchanger allows efficient heat exchange between the lid part and the metal member, thus providing high heat exchange efficiency.

The semiconductor unit according to the present invention includes the above heat exchanger and the semiconductor device on the metal member; with such a simple structure, the semiconductor unit can reduce the temperature rise due to heat generated from the semiconductor device.

The semiconductor manufacturing apparatus according to the present invention includes the above heat exchanger, and the metal member is an electrode that attracts a semiconductor wafer; thus, the metal member can be used both as a table on which the semiconductor wafer is placed and as a processing electrode. With such a simple structure, the semiconductor manufacturing apparatus can reduce the generation of heat from the electrode and can therefore reduce the temperature rise in the wafer, thus allowing the manufacture of semiconductor devices with high dimensional accuracy.

BRIEF DESCRIPTION OF DRAWINGS

FIG. 1(a) is a perspective view of the channel member, FIG. 1(b) is a plan view of a wall part that forms the channel member, and FIG. 1(c) is a sectional view taken along line A-A in FIG. 1(a).

FIGS. 2(a) and 2(b) illustrate examples in which the width of the channel increases from one end toward the other end in the height direction of the channel, and FIG. 2(c) illustrates an example in which the width of the channel increases from the center toward both ends in the height direction of the channel.

FIG. 3(a) is a plan view of a ceramic green sheet in which a through-hole is formed, and FIG. 3(b) is a plan view of the ceramic green sheet in FIG. 3(a) after a throwaway piece is fitted in the through-hole.

FIG. 5(a) is a sectional view taken along line A-A in FIG. 1(a), FIG. 5(b) is an enlarged view of broken-line area B in FIG. 5(a), and FIG. 5(c) is an enlarged view of broken-line area C in FIG. 5(a).

FIG. 6(a) is a sectional view taken along line A-A in FIG. 1(a), FIG. 6(b) is an enlarged view of broken-line area C in FIG. 6(a), and FIG. 6(c) is an enlarged view of broken-line area B in FIG. 6(a).

FIG. 8(a) is a sectional view of a rectangular gap, and FIG. 8(b) is a sectional view of a gap whose width increases toward the channel.

FIG. 9(a) is a schematic sectional view illustrating the use of a die, FIG. 9(b) is a schematic sectional view illustrating the use of laser light, and FIGS. 9(c) and 9(d) are partial sectional views taken in a plane perpendicular to cross sections of the ceramic green sheets formed by the respective methods.

FIG. 10(a) is a set of partial exploded plan views of a wall part composed of three sheet-shaped bodies, showing the relationship between the channel and the barriers of the wall part in the area surrounded by broken line G in FIG. 1(b), and FIG. 10(b) is a conceptual sectional view showing an arc-shaped portion of the channel as extending in a straight line.

DESCRIPTION OF EMBODIMENTS

Embodiments of the present invention will be described below.

An example of an embodiment of a channel member according to the present invention will now be described with reference to FIG. 1.

Figure 1:
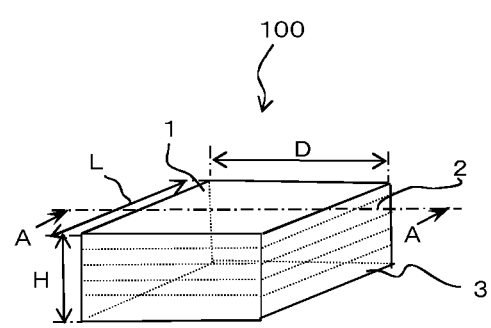
FIG. 1 illustrates an example of a channel member according to an embodiment.
Figure 1:
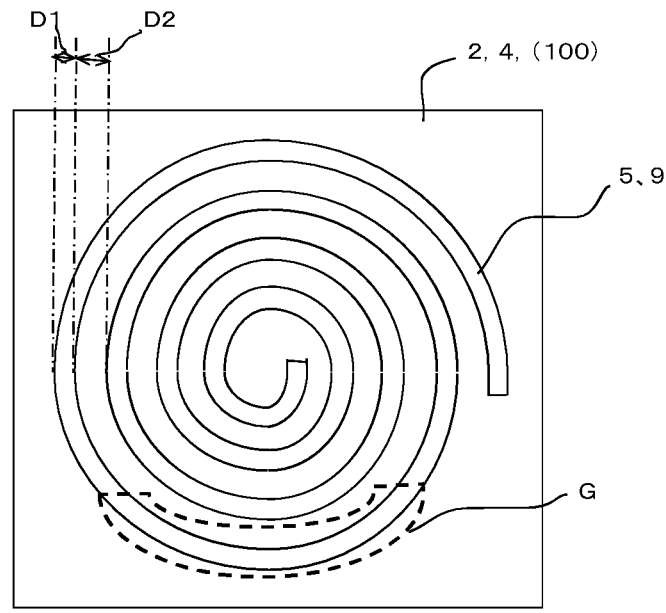
Figure 1:
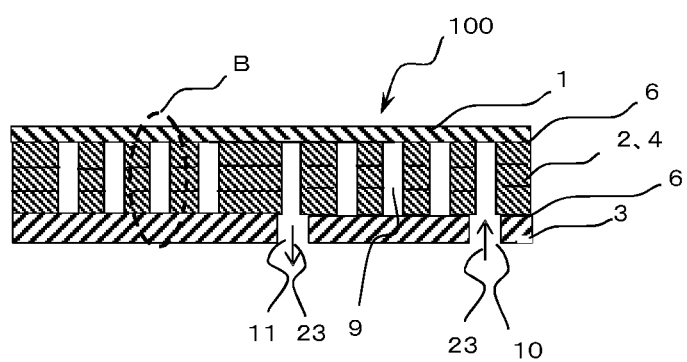

FIG. 1 illustrates an example of a channel member according to this embodiment: FIG. 1(a) is a perspective view of the channel member, FIG. 1(b) is a plan view of a wall part that forms the channel member, and FIG. 1(c) is a sectional view of a channel shown in FIG. 1(a) taken along line A-A, which passes through substantially the center of the channel in plan view.

As shown in FIGS. 1(a) to 1(c), a channel member 100 according to this embodiment is composed of a lid part 1, a wall part 2, and a bottom plate part 3 and has an inner spiral channel 9 through which a fluid 23, such as a gas or liquid, flows.

It is important that the channel member 100 according to this embodiment have the inner spiral channel 9 through which the fluid 23 flows, that the channel 9 be formed by the lid part 1, the bottom plate part 3, and the wall part 2 connected to the lid part 1 and the bottom plate part 3, and that the wall part 2 be made of a ceramic laminate.

Because the channel 9 through which the fluid 23 flows in the channel member 100 according to this embodiment has a spiral shape, the contact area between the fluid 23 and the channel member 100 can be increased despite its compact structure, thus providing high heat exchange efficiency. In addition, because the channel 9 is formed by the wall part 2 connected to the lid part 1 and the bottom plate part 3, the channel 9 can be easily formed in a complicated pattern by forming a hole that is to form the channel 9 using the wall part 2 alone in advance and then placing the lid part 1 the bottom plate part 3 on the wall part 2.

Because the wall part 2 is made of a ceramic, the channel walls of the wall part 2 are resistant to corrosion and are therefore resistant to collapse even if the fluid 23 is a fluid highly corrosive to metals, such as lithium bromide. Because the wall part 2 is made of a laminate, the cross-sectional area of the channel 9 can be easily increased. In other words, the contact area between the wall part 2 and the fluid 23 can be increased. This improves the heat exchange efficiency between the channel member 100 and the fluid 23. The reason why the cross-sectional area of the channel 9 can be easily increased if the wall part 2 is made of a laminate will be described later.

The lid part 1 and the bottom plate part 3 may be made of materials such as ceramics, metals, and resins. Preferably, the lid part 1 and the bottom plate part 3 are made of materials with high heat and corrosion resistance. In particular, it is desirable that the lid part 1 be made of an insulating material that has high thermal conductivity and that allows wiring layers such as electrodes to be directly mounted thereon.

Examples of ceramics that can be used as the materials for the wall part 2, the lid part 1, and the bottom plate part 3 include alumina, silicon nitride, aluminum nitride, silicon carbide, mullite, zirconia, and composites thereof.

If the lid part 1, the wall part 2, and the bottom plate part 3 are made of ceramics, they may be formed using ceramic green sheets and may then be bonded and fired together. If the lid part 1 and the bottom plate part 3 are made of metal or resin materials, the lid part 1 and the bottom plate part 3 may be placed on a sintered ceramic wall part 2 fired in advance and may then be secured thereto, for example, using screws, by crimping a metal frame (not shown), or by brazing.

In FIG. 1, the channel member 100 has an inlet 10 and an outlet 11 for the fluid 23 in the bottom of the bottom plate part 3 and is configured such that the fluid 23 is supplied from the outside of the spiral channel 9 and is discharged from the inside of the channel 9. The channel member 100, however, is not necessarily configured as above, but may be configured such that the fluid 23 is supplied or discharged from the lid part 1 or the wall part 2. For example, the inlet 10 and the outlet 11 may be provided at appropriate positions depending on the installation site and maintenance of the channel member 100. Although the channel 9 illustrated herein has a circular spiral shape, it may have any other spiral shape, such as a triangular or rectangular spiral shape.

As an example of such a channel member, one having the inlet 10 and the outlet 11 for the fluid 23 in the lid part 1 facilitates maintenance, for example, when provided inside a car hood. As another example, one having the inlet 10 and the outlet 11 in the same side surface of the wall part 2 allows the use of simple piping for supplying and discharging the fluid 23 in power semiconductor units and semiconductor manufacturing apparatuses used in semiconductor manufacturing processes.

Figure 2:
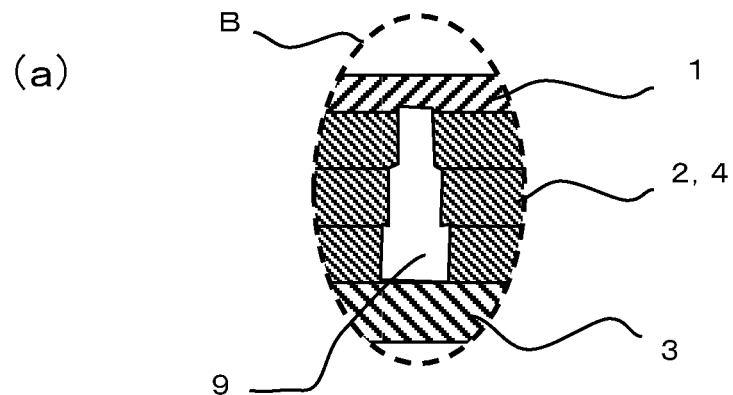
FIG. 2 illustrates other examples of cross-sectional shapes of the channel member according to this embodiment perpendicular to the direction in which a fluid flows, showing enlarged sectional views of the area surrounded by the broken line in the sectional view in FIG. 1(c)
Figure 2:
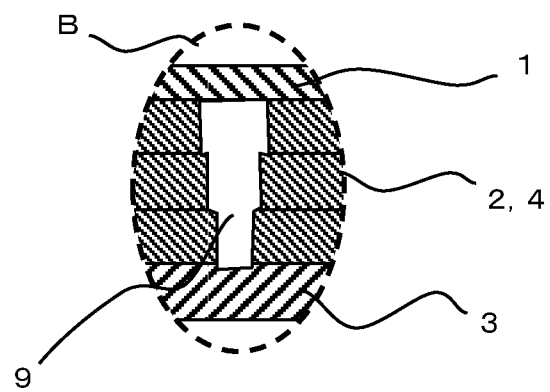
Figure 2:
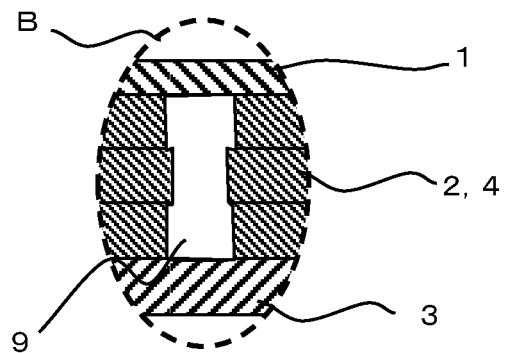

FIG. 2 illustrates other examples of cross-sectional shapes of the channel 9 of the channel member 100 according to this embodiment perpendicular to the direction in which the fluid 23 flows, showing enlarged sectional views of area B surrounded by the broken line in the sectional view in FIG. 1(c): FIGS. 2(a) and 2(b) illustrate examples in which the width of the channel 9 increases from one end toward the other end in the height direction of the channel, and FIG. 2(c) illustrates an example in which the width of the channel 9 increases from the center toward both ends in the height direction of the channel. FIG. 2(a) illustrates an example in which the width of the channel 9 is smaller near the lid part 1 and is larger near the bottom plate part 3, and FIG. 2(b) illustrates an example in which the width of the channel 9 is larger near the lid part 1 and is smaller near the bottom plate part 3.

In the channel member according to this embodiment, the width of the channel as viewed in a cross section of the channel perpendicular to the direction in which the fluid flows preferably increases from one end toward the other end in the height direction of the channel.

For example, if the inlet 10 and the outlet 11 for the fluid 23 are located in the lid part 1 or at positions near the lid part 1 in the wall part 2, the width of the channel 9 may increase from the lid part 1 toward the bottom plate part 3, as shown in FIG. 2(a), so that the fluid 23 supplied to the channel 9 flows more easily from the top (near the lid part 1) to the bottom (near the bottom plate part 3) of the channel 9 while circulating through the spiral channel 9. The flow of the fluid 23 to the top of the channel 9 gains velocity with decreasing width of the channel 9. For example, if a heat exchange target, such as a semiconductor device, is mounted on the lid part 1, which is therefore more influenced by the heat exchange target, the fluid 23 flows quickly near the lid part 1 and forms a flow that contacts the lid part 1. This facilitates the heat exchange between the lid part 1 and the fluid 23, thus efficiently cooling the heat exchange target.

If the inlet 10 and the outlet 11 for the fluid 23 are located in the bottom plate part 3, the width of the channel 9 may increase from the bottom plate part 3 toward the lid part 1, as shown in FIG. 2(b), so that the fluid 23 supplied to the channel 9 flows more easily from the bottom (near the bottom plate part 3) to the top (near the lid part 1) of the channel 9 while circulating through the spiral channel 9. For example, if a heat exchange target, such as a semiconductor device, is mounted on the lid part 1, the larger contact area between the lid part 1 and the fluid 23 facilitates the heat exchange between the lid part 1 and the fluid 23, thus efficiently cooling the heat exchange target. The example illustrated in FIG. 2(b) is particularly preferred because it is less influenced by the positions of the fluid inlet 10 and outlet 11.

In FIGS. 2(a) and 2(b), the wall part 2 is composed of three sheet-shaped bodies 4, and the width of the channel 9 increases stepwise in a rectangular shape from one end to the other end in the height direction of the channel 9. The width of the channel 9, however, may change in an inclined or curved shape from one end to the other end in the height direction of the channel 9. The inlet 10 and the outlet 11 may be provided at appropriate positions depending on the purpose of the channel member.

In the channel member 100 according to this embodiment shown in FIG. 2(c), the width of the channel 9 as viewed in a cross section of the channel 9 perpendicular to the direction in which the fluid 23 flows is smaller in the center of the channel 9 than near the lid part 1 and the bottom plate part 3 in the height direction of the channel 9.

For example, as shown in FIG. 1(c), if the inlet 10 and the outlet 11 for the fluid 23 are located in the bottom plate part 3 in the example in which the width of the channel 9 is smaller in the center thereof, the fluid 23 supplied to the channel 9 flows from the bottom (near the bottom plate part 3) to the top (near the lid part 1) of the channel 9 while circulating through the spiral channel 9. The narrow center of the channel 9 in the height direction mixes the fluid 23 that has exchanged heat with the wall part 2 with the fluid 23 flowing at a position away from the wall part 2 and further diffuses the fluid 23 toward the lid part 1 and the bottom plate part 3 while increasing the velocity thereof. This further improves the heat exchange efficiency between the channel member 100 and the fluid 23.

In FIG. 2(c), the wall part 2 is composed of three sheet-shaped bodies 4, and the width of the channel 9 is smaller in the center thereof and increases stepwise from the center thereof toward the lid part 1 and the bottom plate part 3. The width of the channel 9, however, may change in an inclined or curved shape.

Figure 3:
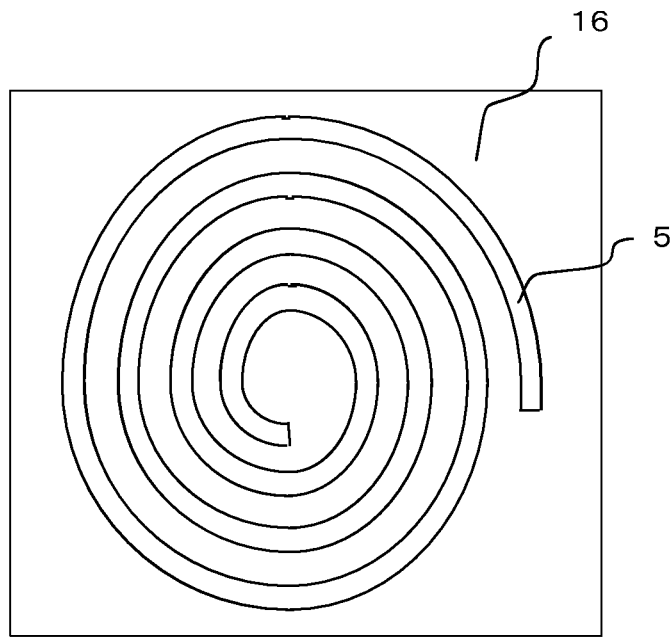
FIG. 3 illustrates an example of a process of fabricating the wall part of the channel member according to this embodiment.
Figure 3:
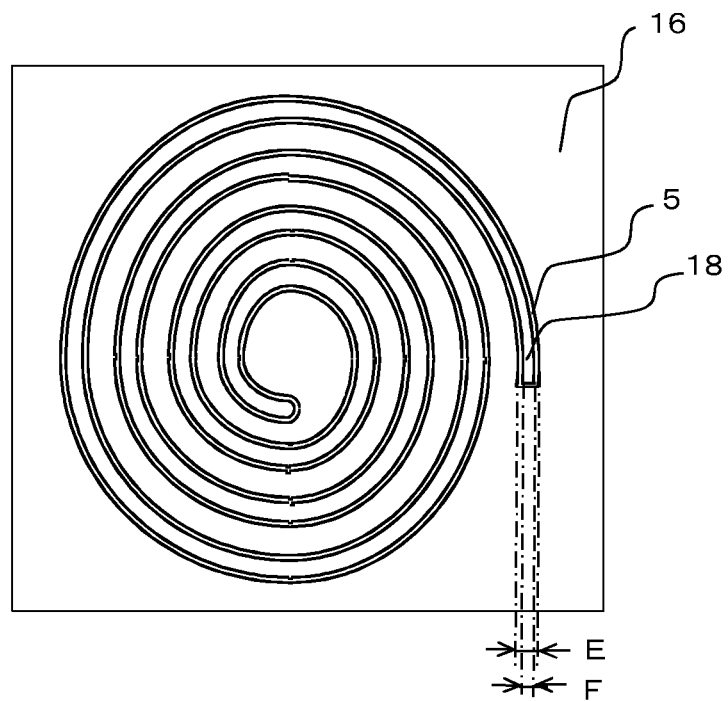

FIG. 3 illustrates an example of a process of fabricating the wall part 2 of the channel member according to this embodiment: FIG. 3(a) is a plan view of a ceramic green sheet in which a through-hole is formed, and FIG. 3(b) is a plan view of the ceramic green sheet in FIG. 3(a) after a throwaway piece is fitted in the through-hole.

If the wall part 2 of the spiral channel member 100 as shown in FIG. 1 is made of ceramic, the formation of a through-hole 5 in a thick wall part 2 made of sintered ceramic by a method such as laser processing results in low productivity and high cost. Accordingly, the spiral through-hole 5 may be formed in a ceramic green sheet 16 by press forming or laser processing, which allows the through-hole 5 to be easily formed in a thick wall part 2.

However, the ceramic green sheet 16 in which the through-hole 5 is formed has a problem in that it sags near the center thereof while being handled during the manufacturing process because of its softness. Thus, a wall part 2 composed of a plurality of ceramic green sheets 16 has a problem in that the individual ceramic green sheets 16 vary in the size and position of the through-hole 5 in the center thereof and also deform so as to decrease the width of the through-hole 5.

An example of a solution to this problem is as follows. The spiral through-hole 5 is formed in each ceramic green sheet 16 by press forming or laser processing, and a throwaway piece 18 cut when the through-hole 5 is formed is fitted back into the through-hole 5. The ceramic green sheets 16 are handled in this state until the lamination of the lid part 1 and the bottom plate part 3. Thereafter, the throwaway pieces 18 are removed from the through-hole 5, and the lid part 1 and the bottom plate part 3 are bonded to the ceramic green sheets 16 that are to form the wall part 2. This reduces, for example, the variation in the position of the through-hole 5 in the ceramic green sheets 16 and deformation that decreases the width of the through-hole 5, which tends to occur during handling.

Although the throwaway piece 18 illustrated in FIG. 3(b) is formed as one piece extending from the outside to the inside of the through-hole 5, the throwaway piece 18 may be divided and fitted in the entire through-hole 5. If barriers, described later, are provided, the throwaway piece 18 may be partially fitted in the through-hole 18, with a certain space remaining therein. Thus, dividing the throwaway piece 18 into small segments or partially fitting the throwaway piece 18 reduces problems such as deformation and chipping of the throwaway piece 18 until fitting into the through-hole 5 and also facilitates the procedure of removing the throwaway piece 18 from the through-hole 5.

The width F of the throwaway piece 18 may be somewhat smaller than the width E of the through-hole 5. This facilitates the fitting and removal of the throwaway piece 18 into and from the through-hole 5 and also reduces the risk of damage to the through-hole 5 in the ceramic green sheets 16.

For example, the width F of the throwaway piece 18 relative to the width E of the through-hole 5 depends on the thickness of the ceramic green sheets 16. For example, if the thickness of the ceramic green sheets 16 after sintering is 0.6 to 1.5 mm, the difference between the width E of the through-hole 5 and the width F of the throwaway piece 18 is preferably 0.2 to 0.6 mm (a clearance of 0.1 to 0.3 mm per side).

In particular, when the wall part 2, which is made of a laminate, is fabricated by applying a binder to a plurality of ceramic green sheets 16, laminating the ceramic green sheets 16 on top of each other, and bonding the ceramic green sheets 16 together by pressing, the throwaway piece 18 fitted in the through-hole 5 allows uniform pressing, thus reducing problems with bonding due to insufficient pressing. This inhibits delamination (interlayer separation) in the channel 9 of the channel member 100 after firing.

As a method for manufacturing a channel member having the channel 9 as shown in FIG. 2(c), after the ceramic green sheets 16 that are to form the wall part 2 are laminated and bonded together by pressing, the throwaway pieces 18 may be removed from the top and bottom of the ceramic green sheets 16 to form the through-hole 5. This method allows the through-hole 5 to have less variation in position and also reduces problems such as deformation that decreases the width of the through-hole 5.

As a method for manufacturing a channel member having the channel 9 as shown in FIG. 2(a) or 2(b), ceramic green sheets 16 may be used in which the through-hole 5 is formed such that the width of the channel 9 increases from one end to the other end in the height direction.

If the spiral through-hole 5 is formed by laminating a plurality of ceramic green sheets 16 such that the width of the through-hole 5, which is to form the channel 9, is larger near the lid part 1 and is smaller near the bottom plate part 3, the throwaway pieces 18 may be removed in the direction from the bottom plate part 3 toward the lid part 1 after the ceramic green sheets 16 that are to form the wall part 2 are laminated and bonded together by pressing. If the width of the through-hole 5, which is to form the channel 9, is smaller near the lid part 1 and is larger near the bottom plate part 3, the throwaway pieces 18 may be removed in the direction from the lid part 1 toward the bottom plate part 3 after the ceramic green sheets 16 that are to form the wall part 2 are laminated and bonded together by pressing. This allows the laminate to have less variation in the position of the through-hole 5 and less deformation along the width of the through-hole 5.

Figure 4:
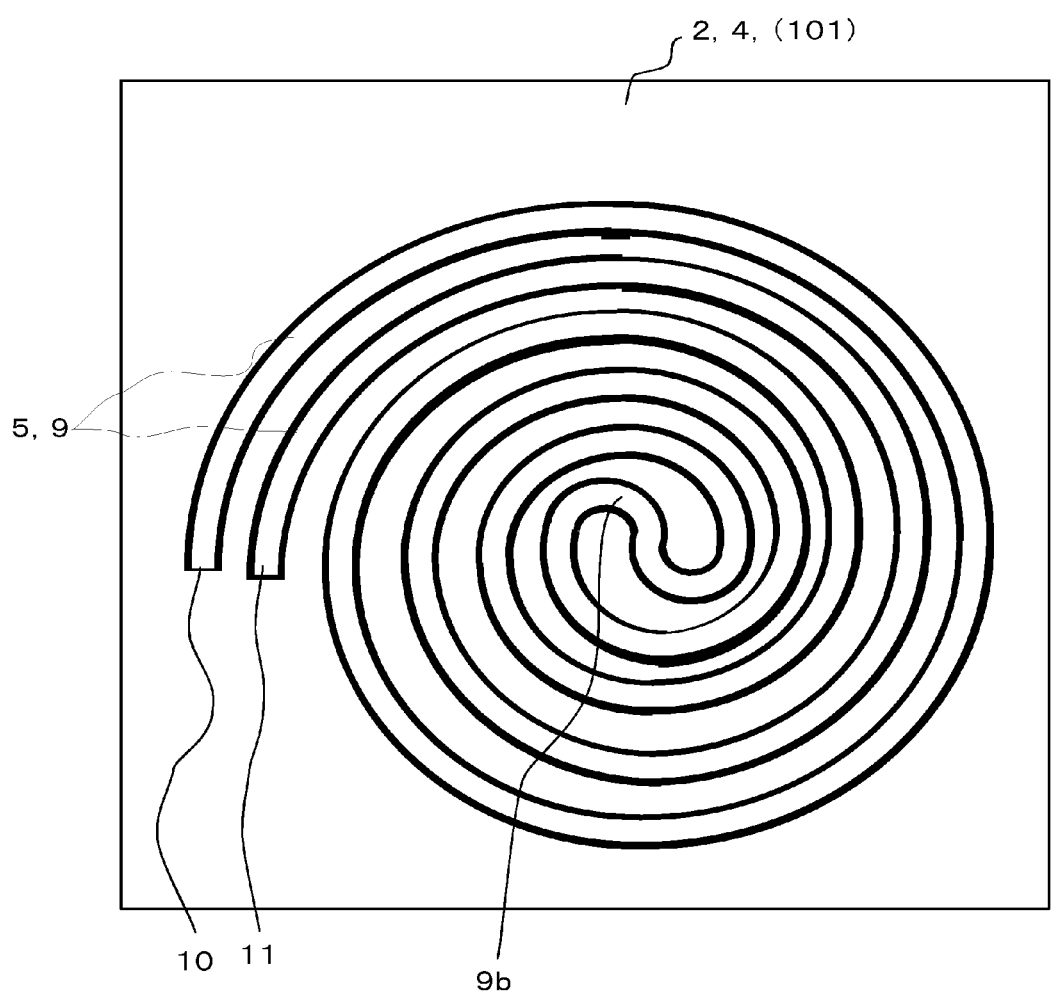
FIG. 4 is a plan view of another example of a wall part that forms a channel member according to this embodiment.

FIG. 4 is a plan view of another example of a wall part that forms a channel member according to this embodiment.

A channel member 101 illustrated in FIG. 4 has a spiral channel 9 including a fluid inlet 10 and a fluid outlet 11 at similar positions in the periphery thereof and a turnaround portion 9b near the center thereof. The portion of the channel 9 between the inlet 10 and the turnaround portion 9b (hereinafter referred to as "inward path") is adjacent to the portion of the channel 9 between the turnaround portion 9b and the outlet 11 (hereinafter referred to as "outward path"). That is, the channel 9 is formed such that the fluid flows from the periphery to the center and then flows back to the periphery.

Thus, for example, if a heat exchange target is mounted on the lid part 1 bonded to the wall part 2 of the channel member 104 having the spiral channel 9 including the turnaround portion 9b, heat exchange occurs between the adjacent inward and outward paths. This reduces the temperature variation near the center and in the periphery of the lid part 1. In addition, because the inlet 10 and the outlet 11 for the fluid 23 can be provided close to each other, a fluid supply pipe to which the inlet 10 for the fluid 23 is connected and a fluid discharge pipe to which the outlet 11 for the fluid 23 is connected can be provided close to each other when the channel member 104 is used as a heat exchanger (hereinafter not shown) in a semiconductor unit or semiconductor manufacturing apparatus. This simplifies the structure of the apparatus and facilitates maintenance.

Although the channel member 104 illustrated in FIG. 4 has the inlet 10 and the outlet 11 for the fluid 23 located in the periphery of the spiral channel 9, the inlet 10 and the outlet 11 may be located near the center of the channel 9, with the turnaround portion 9b located in the periphery thereof. This structure allows the fluid 23, serving as a coolant, to be supplied near the center of the lid part 1, on which a heat-generating device is mounted, and also allows the fluid 23 that has reached the highest temperature to be quickly discharged near the center.

Because the spiral channel 9 has the inward and outward fluid paths adjacent to each other, when the sheet-shaped bodies 4 that are to form the wall part 2 are formed by forming the through-hole 5 in unfired ceramic green sheets 16, as shown in FIG. 3, it is effective to form the through-hole 5 in each ceramic green sheet 16 and then fit the throwaway piece 18 into the through-hole 5 to prevent deformation during handling and to ensure that the pressure applied during pressing is transferred to the individual layers when they are bonded together by pressing.

The wall part of the channel member according to this embodiment preferably has a protrusion and a recess inside the channel.

For example, the wall part 2 shown in FIG. 2(a) has protrusions above the center thereof and recesses below the center thereof. The wall part 2 shown in FIG. 2(b) has the inverted shape of the shape shown in FIG. 2(a). The wall part 2 shown in FIG. 2(c) has protrusions in the center thereof and recesses above and below the center thereof.

Because the wall part 2 of the channel member 100 according to this embodiment has protrusions and recesses 33 inside the channel 9, the wall part 2 that forms the channel 9 has an increased surface area, and the channel 9 has an increased volume for allowing the fluid 23 to flow therethrough. In addition, the protrusions and recesses 33 generate turbulence in the fluid 23, such as a gas or liquid, flowing through the channel member 100, thus improving the heat exchange efficiency between the wall part 2 and the fluid.

Figure 5:
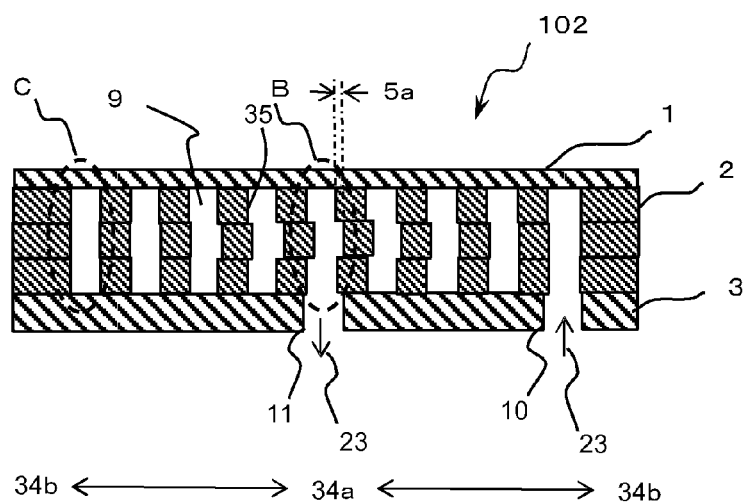
FIG. 5 illustrates another example of a channel member according to this embodiment.
Figure 5:
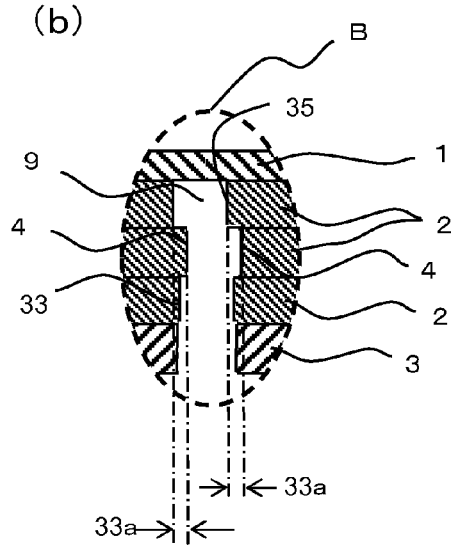
Figure 5:
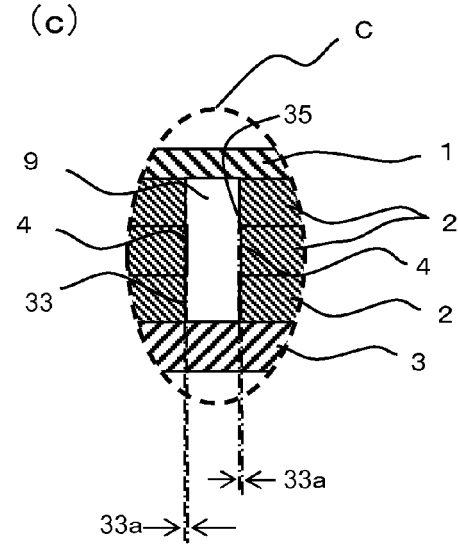

FIG. 5 illustrates another example of a channel member according to this embodiment: FIG. 5(a) is a sectional view taken along line A-A in FIG. 1(a), FIG. 5(b) is an enlarged view of broken-line area B in FIG. 5(a), and FIG. 5(c) is an enlarged view of broken-line area C in FIG. 5(a).

In a channel member 102 shown in FIG. 5, the maximum difference 33a between the protrusions and recesses 33 of the wall part 2 that forms the channel 9 in the center 34a of the channel member 102 as viewed in a cross section of the channel 9 perpendicular to the direction in which the fluid 23 flows is larger than the maximum difference between the protrusions and recesses 33 of the wall part 2 that forms the channel 9 in the periphery 34b of the channel member 102 (the portions of the wall part 2 inside the channel 9 may be hereinafter referred to as inner walls 35 of the channel 9).

Because the inner walls 35 of the channel 9 have the protrusions and recesses 33 as viewed in a cross section of the channel 9 perpendicular to the direction in which the fluid 23 flows, turbulence occurs in the fluid 23 flowing through the channel 9, thus improving the heat exchange efficiency between the channel member 102 and the fluid 23.

In addition, because the maximum difference 33a between the protrusions and recesses 33 of the wall part 2 that forms the channel 9 in the center 34a as viewed in a cross section of the channel 9 perpendicular to the direction in which the fluid 23 flows is larger than the maximum difference between the protrusions and recesses 33 of the wall part 2 that forms the channel 9 in the periphery 34b, a larger turbulence occurs in the fluid 23 in the center 34a, thus improving the heat exchange efficiency in the center 34a of the channel member 102.

Thus, in particular, if the channel member 102 shown in FIG. 5 is used as a channel member for heat exchange with a heat exchange target that generates more heat in the center thereof, it can maintain a uniform temperature throughout the heat exchange target.

The center 34a of the spiral channel member 102 refers to the region surrounded by a circle that is centered at the midpoint of a line passing through the center of the circle equivalent diameter of the largest portion in which the channel 9 is formed and that has a diameter of 25% of the circle equivalent diameter, and the periphery 34a of the channel member 102 refers to the region outside the center 34b.

In this embodiment, as shown in FIGS. 5(b) and 5(c), the maximum difference 33a between the protrusions and recesses 33 of the inner walls 35 of the channel 9 in the center 34a and the periphery 34b as viewed in a cross section of the channel 9 perpendicular to the direction in which the fluid 23 flows refers to the maximum difference in step height between the protrusions and recesses 33 of the inner walls 35. If the maximum difference 33a between the protrusions and recesses 33 of the inner walls 35 in the center 34a as viewed in a cross section of the channel 9 perpendicular to the direction in which the fluid 23 flows is larger than the maximum difference 33a between the protrusions and recesses 33 of the inner walls 35 in the periphery 34b, not only does a larger turbulence occur, but the inner walls 35 also have a larger surface area in contact with the fluid 23, even if the inner diameter of the channel 9 is equal, thus improving the heat exchange efficiency in the center 34a of the channel member 102.

In addition, if the maximum difference 33a between the protrusions and recesses 33 of the inner walls 35 of the channel 9 is larger in the center 34a than in the periphery 34b, the channel 9 causes a lower pressure loss as a whole than one having the maximum difference 33a between the protrusions and recesses 33 throughout the entire channel 9.

The maximum difference 33a between the protrusions and recesses 33 of the inner walls 35 of the channel 9 in a cross section of the channel 9 perpendicular to the direction in which the fluid 23 flows may increase gradually from the periphery toward the center. Accordingly, the turbulence generated in the fluid 23 by the protrusions and recesses 32 of the inner walls 35 of the channel 9 increases from the periphery 34b toward the center 34a. As a result, the heat exchange efficiency of the channel member 102 is highest in the center 34a and decreases toward the periphery 34b. A heat exchange target that exchanges heat with a channel member generates more heat in the center thereof; if such a heat exchange target is mounted in the center of the channel member 102 according to this embodiment, it can lower the temperature in the center, which reaches particularly high temperature. This reduces the temperature gradient between the center and the periphery, thus providing more uniform temperature.

Alternatively, in a channel member according to this embodiment, the maximum difference between the protrusions and recesses of the wall part 2 that forms the channel 9 in the periphery of the channel member may be larger than the maximum difference between the protrusions and recesses of the wall part 2 that forms the channel 9 in the region other than the periphery of the channel member.

Figure 6:
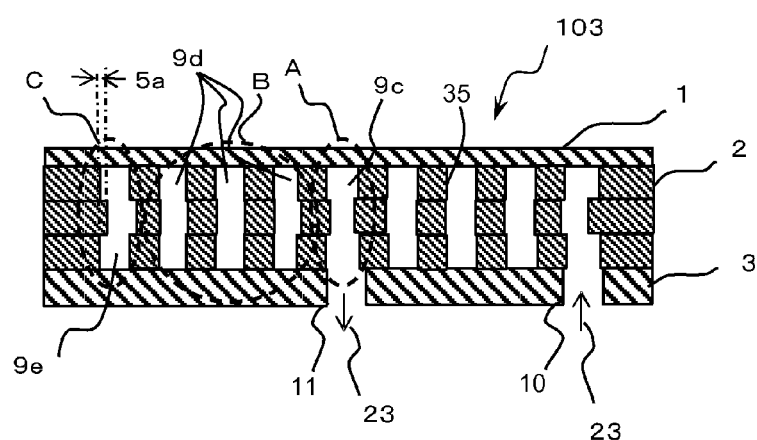
FIG. 6 illustrates still another example of a channel member according to this embodiment.
Figure 6:
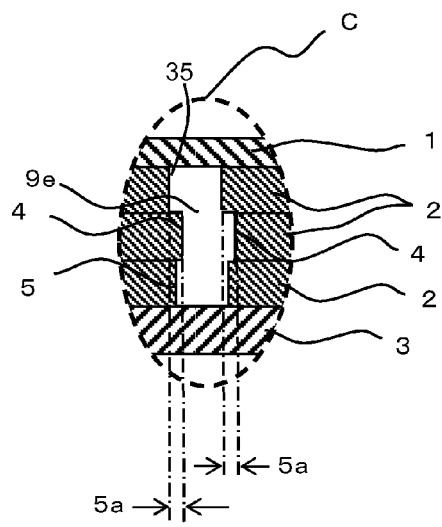
Figure 6:
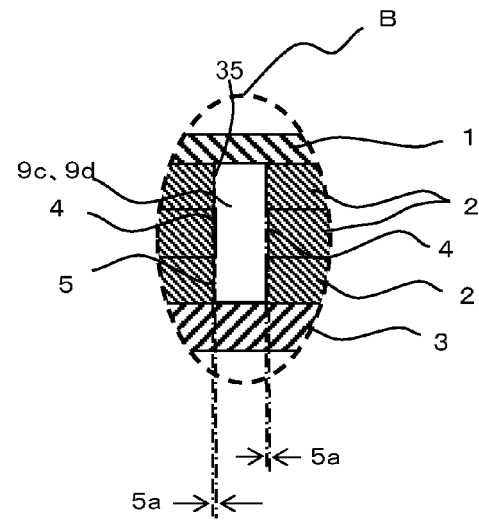

FIG. 6 illustrates another example of a channel member according to this embodiment: FIG. 6(a) is a sectional view taken along line A-A in FIG. 1(a), FIG. 6(b) is an enlarged view of broken-line area C in FIG. 6(a), and FIG. 6(c) is an enlarged view of broken-line area B in FIG. 6(a).

In this embodiment, it is important that the wall part 2 have the protrusions and recesses 33 inside the channel 9 as viewed in a cross section of the channel 9 perpendicular to the direction in which the fluid 23 flows and that the maximum difference 33a between the protrusions and recesses 33 of the wall part 2 that forms channel segments 9e in the outermost periphery be larger than the maximum difference 33a between the protrusions and recesses 33 of the wall part 2 that forms channel segments 9c and 9d other than the channel segments 9e in the outermost periphery (the portions of the wall part 2 inside the channel 9 may be hereinafter referred to as the inner walls 35 of the channel 9).

In the channel member 103 according to this embodiment, the inner walls 35 have the protrusions and recesses 33 inside the channel 9 as viewed in a cross section of the channel 9 perpendicular to the direction in which the fluid 23 flows, and the maximum difference 33a between the protrusions and recesses 33 of the inner walls 35 that form the channel segments 9e in the outermost periphery of the channel member 103 is larger than the maximum difference 33a between the protrusions and recesses 33 of the inner walls 35 that form the channel segments 9c and 9d in the region other than the outermost periphery. This allows a particularly large turbulence to be generated in the fluid 23 by the protrusions and recesses 33 of the inner walls 35 in the channel segments 9e in the periphery of the channel member 103, thus improving the heat exchange efficiency in the periphery of the channel member 103.

Thus, in particular, if the channel member 103 according to this embodiment is used as a channel member for heat exchange with a heat exchange target that generates more heat in the periphery thereof, it can maintain uniform temperature throughout the heat exchange target.

Because the maximum difference 33a between the protrusions and recesses 33 of the inner walls 35 that form the channel segments 9e in the outermost periphery as viewed in a cross section of the channel 9 perpendicular to the direction in which the fluid 23 flows is larger than the maximum difference 33a between the protrusions and recesses 33 of the inner walls 35 that form the other channel segments 9c and 9d, the channel 9 causes a lower pressure loss as a whole than one having a large maximum difference 33a between the protrusions and recesses 33 of the inner walls 35 throughout the entire channel 9. This allows the fluid 23 to flow smoothly, thus improving the heat exchange efficiency of the entire channel member 103 and also improving the heat exchange efficiency in the periphery of the channel member 103, in which heat tends to remain.

The channel segments 9e in the periphery as viewed in a cross section of the channel 9 perpendicular to the direction in which the fluid 23 flows include at least the channel segments 9e in the outermost periphery. The number of channel segments 9e may be set, for example, based on the size of the channel member 102 and the size of the heat exchange target. For example, the number of channel segments 9e may be set within the range of 50% or less of the number of channel segments 9 arranged in a row as viewed in a cross section of the channel 9 perpendicular to the direction in which the fluid 23 flows.

To improve the heat exchange efficiency in the periphery of the channel member 103 according to this embodiment, the maximum difference 33a between the protrusions and recesses 33 of the inner walls 35 that form the channel 9 may be largest in the inner walls 35 of the channel segments 9e in the outermost periphery. This further improves the heat exchange efficiency in the periphery of the channel member 103, in which heat tends to remain.

During extended use, heat remaining in the periphery of the channel member 103 may propagate toward and remain in the center thereof. In addition, for example, the temperature in the center of the spiral channel 9 may rise as the fluid 23 that has exchanged heat in the periphery flows into the center.

Accordingly, the maximum difference 33a between the protrusions and recesses 33 of the inner walls 35 that form the channel segments 9e in the periphery of the channel member 103 as viewed in a cross section of the channel 9 perpendicular to the direction in which the fluid 23 flows may be larger than the maximum difference 33a between the protrusions and recesses 33 of the inner walls 35 that form the channel segments 9c and 9d in the region other than the periphery, and at the same time, the maximum difference 33a between the protrusions and recesses 33 of the inner walls 35 of the channel segments 9 in the center 34a of the channel member 103 may be larger than the maximum difference 33a between the protrusions and recesses 33 of the inner walls 35 of the channel segments (intermediate channel segments) 9 in the region other than the periphery 34b and the center 34a. That is, the maximum difference 33a between the protrusions and recesses 33 of the inner walls 35 that form the individual channel segments 9 may satisfy the following relationship: intermediate channel segments 9d<central channel segments 9c<peripheral channel segments 9e.

Thus, if the channel 9 is formed such that the maximum difference 33a between the protrusions and recesses 33 of the inner walls 35 that form the individual channel segments 9 satisfies intermediate channel segments 9d<central channel segments 9c<peripheral channel segments 9e, the heat exchange efficiency between the channel member 101 and the fluid 11 can be further improved in the periphery and center thereof. If such a channel member 103 is used as a cooling channel for a heat exchange target in which heat tends to remain in the periphery and center thereof, it can reduce the temperature gradient from the periphery toward the center, thus providing more uniform temperature.

The channel members 102 and 103 shown in FIGS. 5 and 6 may be fabricated as described with reference to FIG. 3. To form the wall part 2 having the shape shown in FIG. 5 or 6, the through-hole 5 may be formed in each ceramic green sheet so as to be shifted from each other.

Figure 7:
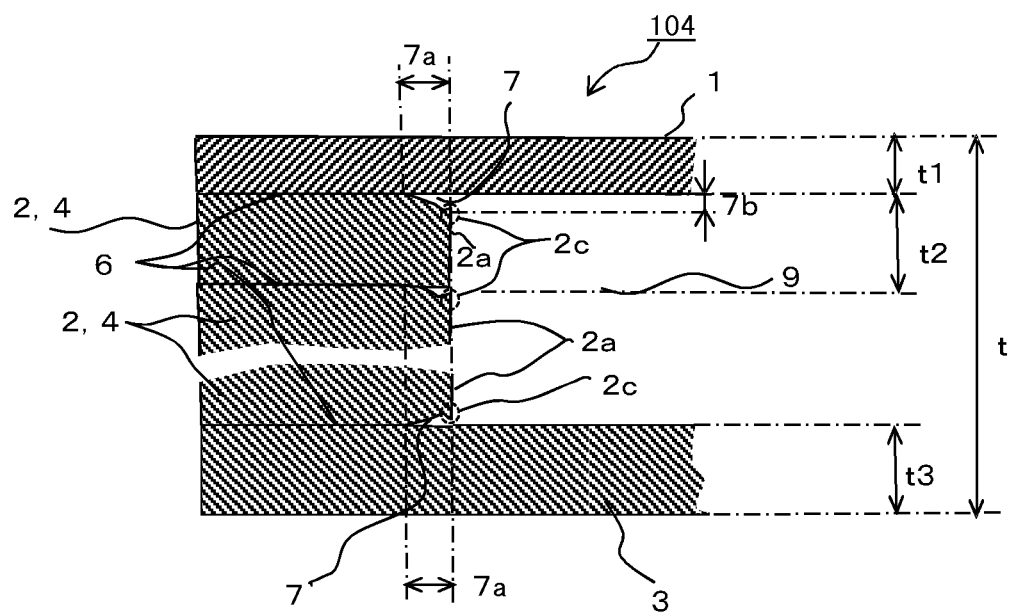
FIG. 7 is a partial enlarged sectional view of a channel member according to this embodiment that has gaps leading to the channel between the lid part, the wall part, and the bottom plate part.

FIG. 7 is a partial enlarged sectional view of a channel member 104 according to this embodiment that has gaps 7 leading to the channel 9 between the lid part 1 and the wall part 2 and between the wall part 2 and the bottom plate part 3.

Because the channel member 104 according to this embodiment shown in FIG. 7 has at least one (in FIG. 7, both) of the gap 7 leading to the channel 9 between the lid part 1 and the wall part 2 and the gap 7 leading to the channel 9 between the wall part 2 and the bottom plate part 3, it has a larger contact area between the channel 9 and the fluid 23 than one having no gap 7. This further improves the heat exchange efficiency between the channel member 104 and the fluid 23.

When the sheet-shaped bodies 4 that are to form the wall part 2 are separately fabricated in the process of manufacturing the channel member 104 according to this embodiment, the through-hole that is to form the channel 9 needs to be formed in the sheet-shaped bodies 4 in advance. During the formation of the through-hole, burrs 2c tend to occur at the end surfaces of the through-hole. Because the channel member 104 according to this embodiment has at least one of the gap 7 leading to the channel 9 between the lid part 1 and the wall part 2 and the gap 7 leading to the channel 9 between the wall part 2 and the bottom plate part 3, the gap 7 reduces the risk of the burrs 2c entering joints 6 between the lid part 1 and the sheet-shaped bodies 4 that are to form the wall part 2 and between the bottom plate part 3 and the sheet-shaped bodies 4 during the lamination of the lid part 1, the wall part 2, and the bottom plate part 3. Thus, the channel 9 is resistant to collapse from the joints 6 in the channel 9 when the fluid 23 is supplied at high pressure to the channel member 104.

Figure 8:
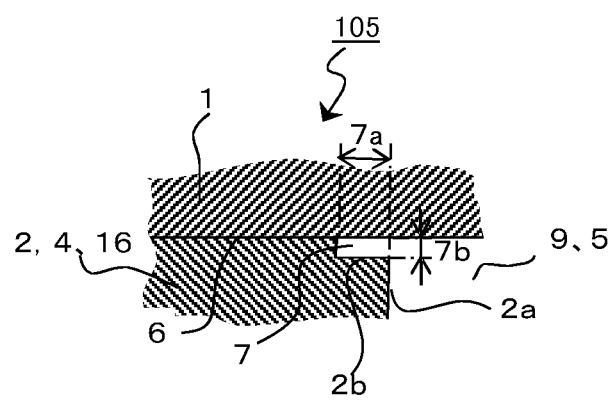
FIG. 8 illustrates other examples of this embodiment.
Figure 8:
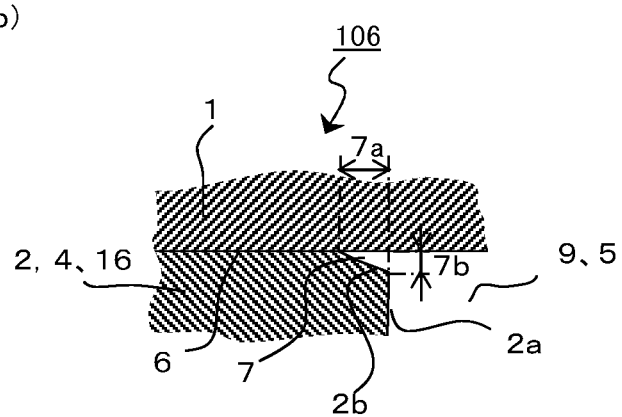

FIG. 8 shows sectional views of examples of gaps of channel members according to this embodiment: FIG. 8(a) illustrates a rectangular gap, and FIG. 8(b) illustrates a gap whose width increases toward the channel (hereinafter simply referred to as triangular).

Channel members 105 and 106 shown in FIGS. 8(a) and 8(b) have rectangular and triangular gaps 7, respectively, leading to the channel 9 in the joint 6 between the lid part 1 and the wall part 2 as viewed in a cross section perpendicular to the direction in which the fluid 23 flows. The gaps 7 have a distance 7a in the depth direction (hereinafter simply referred to as the depth 7a) and a maximum opening height 7b in the vertical direction (hereinafter simply referred to as the maximum height 7b). Although the gap 7 in the joint 6 between the bottom plate part 3 and the wall part 2 is not shown, the lid part 1 may be replaced with the bottom plate part 3 when viewing the figures. The shapes of the gaps 7 are not limited to the above shapes. Thus, if the gaps 7 are rectangular or triangular, even if the burrs 2c occur at the end surfaces 2a of the through-hole 5 when the through-hole 5 that is to form the channel 9 is formed in each ceramic green sheet 16 during the process of forming the through-hole 5 for forming the channel 9, the rectangular or triangular gaps 7, which lead to the channel 9 and have the certain depth 7a and maximum height 7b, accommodate the burrs 2c, thus reducing the risk of the burrs 2c entering the joints 6. This reduces problems with the joints between the lid part 1 and the wall part 2 and between the bottom plate part 3 and the wall part 2 and thus allows the channel 9 to be resistant to collapse.

In the channel member 104 according to this embodiment shown in FIG. 7, the wall part 2 is made of a laminate of a plurality of sheet-shaped bodies 4 and has gaps 7 leading to the channel 9 between the sheet-shaped bodies 4 that form the laminate. Thus, as in the above case, because the channel member 104 has the gaps 7 leading to the channel 9 between the sheet-shaped bodies 4, it has a larger contact area between the end surfaces 2a of the wall part 2 and the fluid 23. This further improves the heat exchange efficiency between the channel member 104 and the fluid 23. In addition, the gaps 7 leading to the channel 9 in the joints 6 between the sheet-shaped bodies 4 that are to form the wall part 2 reduce the risk of the burrs 2c entering the joints 6 when a plurality of unfired ceramic green sheets 16 that are to form the sheet-shaped bodies 4 are laminated on top of each other during the manufacturing process. The gaps 7 may be rectangular, triangular, or trapezoidal.

An example of a method will now be described for forming the rectangular or triangular gaps 7 leading to the channel 9 between the lid part 1 and the wall part 2, between the wall part 2 and the bottom plate part 3, and if the wall part 2 is composed of a plurality of sheet-shaped bodies 4, between the sheet-shaped bodies 4.

Figure 9:
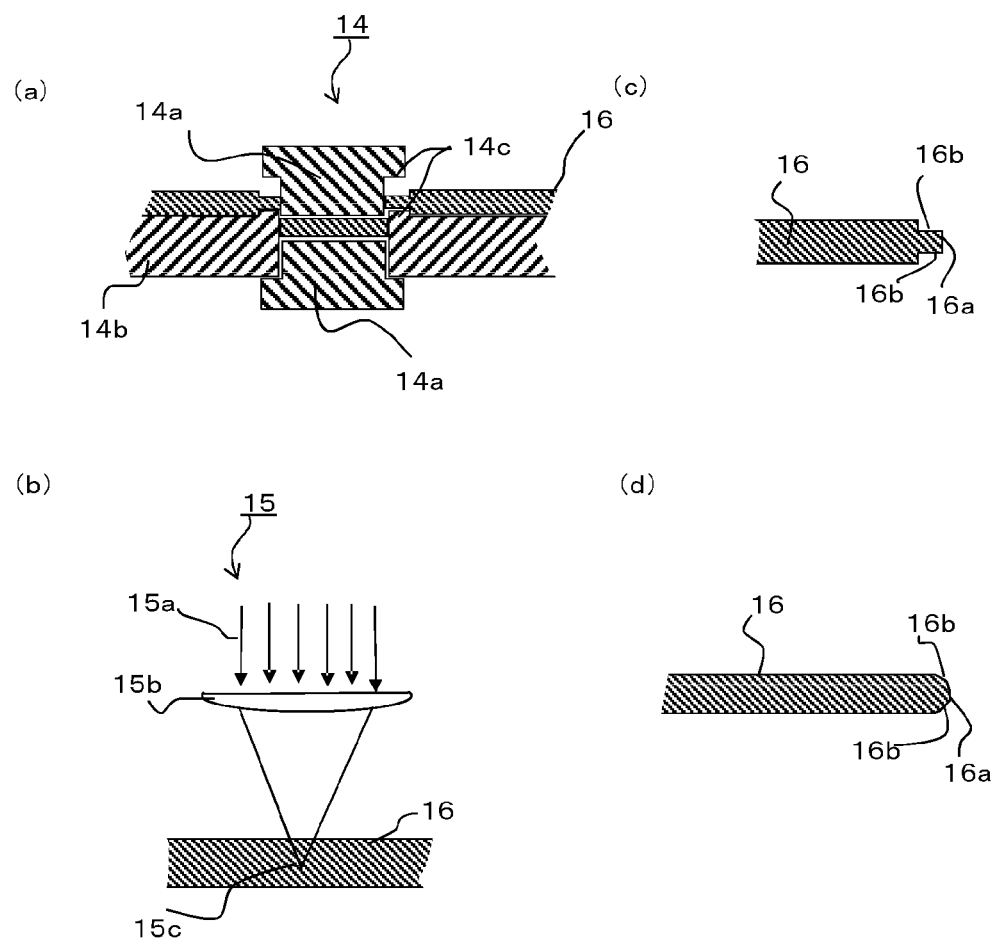
FIG. 9 illustrates examples of methods for forming the through-hole that is to form the channel in ceramic green sheets used to form the wall parts of the channel members according to this embodiment.

FIG. 9 illustrates examples of methods for forming the through-hole that is to form the channel 9 in ceramic green sheets used to form the wall parts of the channel members according to this embodiment: FIG. 9(a) is a schematic sectional view illustrating the use of a die, FIG. 9(b) is a schematic sectional view illustrating the use of laser light, and FIGS. 9(c) and 9(d) are partial sectional views taken in a plane perpendicular to the cross sections of the ceramic green sheets formed by the respective methods.

FIG. 9(a) shows a method for forming the through-hole 5 in a ceramic green sheet 16 using a press-forming apparatus 14. For example, the press-forming apparatus 14 includes a punch 14a and a die 14b including chamfering portions 14c for rectangular chamfering. Using the press-forming apparatus 14, as shown in FIG. 9(c), rectangular chamfers 16b can be formed at the end surfaces 16a of the through-hole 5 in the ceramic green sheet 16.

FIG. 9(b) shows a method for forming the through-hole 5 in a ceramic green sheet 16 using a laser processing apparatus 15. For example, laser light 15a travels through a lens 15b and is focused near the center of the ceramic green sheet 16 in the thickness direction. Thus, as shown in FIG. 9(d), triangular chamfers 16b can be formed at the end surfaces 16a of the through-hole 5 in the ceramic green sheet 16.

If the lid part 1 and the bottom plate part 3 are bonded to such ceramic green sheets 16 having the through-hole 5, the channel 9 is formed by the through-hole 5, and the rectangular or triangular gaps 7 leading to the channel 9 can be formed between the lid part 1 and the wall part 2 composed of the sheet-shaped bodies 4 made of the ceramic green sheets 16, between the bottom plate part 3 and the wall part 2, and between the plurality of sheet-shaped bodies 4.

If a press forming apparatus is used to form the chamfers 16b, the volume of the chamfered portion is pressed into the region adjacent to the chamfered portion, thus increasing the density of the ceramic green sheet 16. Although part of the chamfered portion tends to enter the clearance between the punch and the die and form the burrs 2c at the end surfaces 16a of the through-hole 5, the gaps 7 between the lid part 1 and the wall part 2, between the bottom plate part 3 and the wall part 2, and between the sheet-shaped bodies 4 that form the wall part 2 reduce the risk of the burrs 2c entering the joints 6. The triangular gaps 7 may have a substantially triangular shape such as a wedge or hook shape.

In the process of forming the through-hole 5 for forming the channel 9, the chamfering of the end surfaces 16a of the through-hole 5 in the ceramic green sheet 16 tends to leave higher burrs 2c at the end surfaces as the maximum height 7b of the gaps 7 is increased. For example, if high gaps 7 are formed by punching the ceramic green sheet 16 using the press-forming apparatus 14, the density increased by the volume of the chamfered portion tends to be concentrated near the end surfaces of the ceramic green sheet 16. This causes part of the ceramic green sheet 16 to enter the clearance between the punch and the die, thus forming high burrs 2c.

Thus, the channel members 104, 105, and 106 according to this embodiment preferably have gaps 7 that satisfy the relationship a>b, where a is the depth 7a of the gaps 7 in the direction in which the gaps 7 extend toward the channel 9, and b is the maximum opening height 7b in the vertical direction, as viewed in a cross section perpendicular to the direction in which the fluid 7 flows.

As a result, even if the burrs 2c occur, they are accommodated in the gaps 7, thus reducing the risk of the burrs 2c entering the joints 6, reducing problems with bonding, and inhibiting delamination (interlayer separation). Thus, the channel 9 is resistant to collapse. In addition, because the depth 7a of the gaps 7 is larger than the maximum height 7b of the gaps 7, the fluid 23 entering the gaps 7 tends to form eddy currents in the gaps 7. This improves the heat exchange efficiency between the fluid and the channel members 104, 105, and 106.

The gaps 7 of the channel members 104, 105, and 106 according to this embodiment preferably have a depth 7a of 0.03 to 0.08 mm.

If the gaps 7 of the channel members 104, 105, and 106 have a depth 7a of 0.03 mm or more, the gaps 7 further reduce the risk of the burrs 2c reaching and entering the joints 6 as they occur at the end surfaces 16a during the process of forming the through-hole 5 for forming the channel 9. This further reduces problems with the joints 6. In addition, a larger depth 7a results in a larger surface area of the channel 9 and therefore results in a higher heat exchange efficiency between the fluid 23 and the channel members 104, 105, and 106. If the gaps 7 have a depth 7a of 0.08 mm or less, a sufficient pressure is applied to the joints 6 when the plurality of ceramic green sheets 16 having the through-hole 5 that is to form the channel 9 are laminated and pressed together during the process of forming the through-hole 5 for forming the channel 9. This reduces problems with bonding in the joints 6. The channel 9 of the channel members 104, 105, 106 after firing is resistant to collapse due to cracking from the gaps 7 when a fluid 23 is supplied at high pressure.

Figure 10:
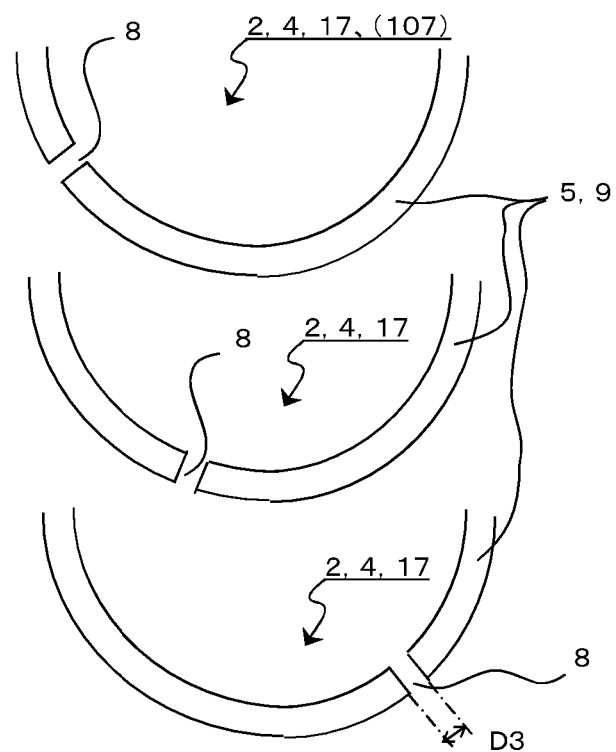
FIG. 10 illustrates an example of barriers of a channel member according to this embodiment.
Figure 10:
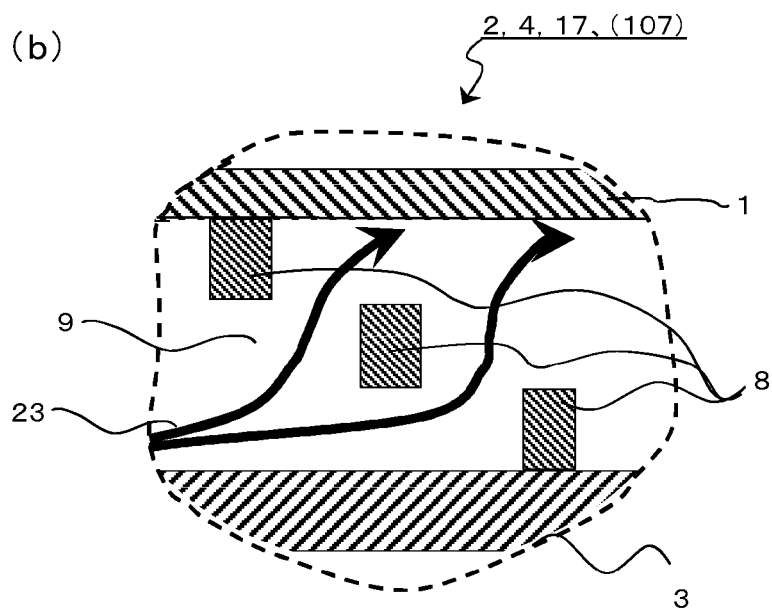

FIG. 10 illustrates an example of barriers of a channel member according to this embodiment: FIG. 10(a) is a set of partial exploded plan views of a wall part composed of three sheet-shaped bodies, showing the relationship between the channel and the barriers of the wall part in the area surrounded by broken line G in FIG. 1(b), and FIG. 10(b) is a conceptual sectional view showing an arc-shaped portion of the channel of the channel member as extending in a straight line.

As shown in FIG. 10(a), a channel member 107 according to this embodiment includes barriers 8 that change the flow of the fluid 23 in the spiral channel 9. Because the barriers 8 change the flow of the fluid 23, as shown in the conceptual view in FIG. 10(b), the fluid 23 flows beside the barriers 8 while diffusing and mixing repeatedly. This allows a fluid 23 with less temperature variation to contact the channel 9, thus further improving the heat exchange efficiency between the channel member 105 and the fluid 23. Although the wall part 2 is made of a laminate of three sheet-shaped bodies 4 and the barriers 8 are arranged in the individual layers so as to be shifted from each other, any barriers 8 may be provided unless they block the flow of the fluid 23.

In the method described above for forming the spiral channel 9 in the wall part 2 by forming the through-hole 5 in unfired ceramic green sheets 17, after the through-hole 5 that is to form the channel 9 is formed in each ceramic green sheet 17, the throwaway piece 18 is fitted into the through-hole 5, for example, to prevent deformation of the ceramic green sheet 17; however, the throwaway piece 18 does not necessarily have to be fitted back into the through-hole 5 if the barriers 8 are provided in the through-hole 5 that is to form the channel 9. The barriers 8 reduce problems such as deformation of the through-hole 5 in the ceramic green sheets 17 along the width thereof and sagging near the spiral center.

As shown in FIGS. 10(a) and 10(b), the barriers 8 in the channel member 107 according to this embodiment are sequentially shifted in the direction in which the fluid 23 flows and in the height direction of the channel 9.

If the barriers 8 are sequentially shifted in the direction in which the fluid 23 flows and in the height direction of the channel 9, with the inlet for the fluid 23 located in the bottom plate part 3, as shown in the conceptual view of the flow of the fluid 23 in FIG. 10(b), the fluid 23 flows between the barriers 8 while diffusing radially toward the lid part 1. Thus, if a heat exchange target is mounted on the lid part 1, heat exchange occurs efficiently between the lid part 1 and the fluid 23.

Although the barriers 8 shown in FIG. 10(b) have a rectangular cross section, they may instead have a circular cross section, a polygonal cross section other than rectangular cross sections, or a chamfered rectangular cross section.

The barriers 8 may be sequentially shifted in the direction in which the fluid 23 flows and in the height direction of the channel 9 in any manner. For example, the barriers 8 may be sequentially shifted toward the lid part 1 and then toward the bottom plate part 3 as viewed in the height direction of the channel 9. Alternatively, the barriers 8 may be randomly arranged.

The channel members 100 to 107 according to this embodiment described above, having high heat exchange efficiency, can be used as channel members for cooling semiconductor units and semiconductor manufacturing apparatuses, as channel members for heat exchange with semiconductor manufacturing apparatuses that repeat heating and warming, and as channel members for heat exchangers such as those for chemical solutions and those in printers that generate large amounts of heat.

A heat exchanger according to this embodiment includes any of the channel members according to this embodiment and a metal member on the lid part.

Because the heat exchanger according to this embodiment includes any of the channel members 100 to 107 according to this embodiment, which have an inner channel through which a fluid flows, and a metal member on the lid part 1, a heat exchange target mounted on the metal member can efficiently exchange heat with the fluid. If the metal member is a wiring layer, a semiconductor device, for example, can be directly mounted on the wiring layer, which contributes to lower manufacturing costs. If the lid part 1 is made of a conductive material such as metal, an insulating material may be disposed on the top surface of the lid part 1, and the metal member may be disposed thereon.

Figure 11:
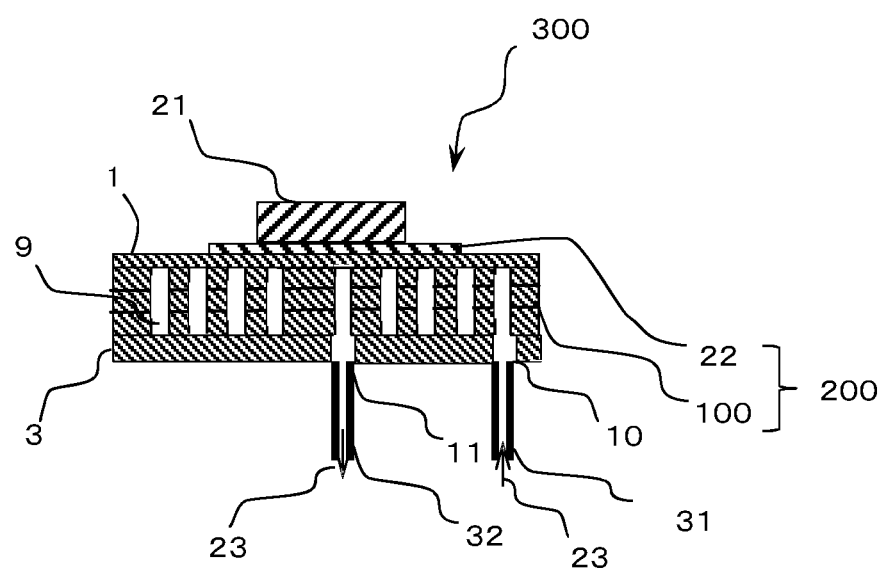
FIG. 11 is a sectional view of an example of a semiconductor unit including a heat exchanger according to this embodiment and a semiconductor device thereon.

FIG. 11 is a sectional view of an example of a semiconductor unit including the heat exchanger according to this embodiment and a semiconductor device thereon.

A semiconductor unit 300 according to this embodiment shown in FIG. 11 includes a heat exchanger 200 including the channel member 100 according to this embodiment and a metal member 22 bonded to the lid part 1 and a semiconductor device 21 on the metal member 22 of the heat exchanger 200. The inlet 10 and the outlet 11 for the fluid 23 in the bottom plate part 3 of the channel member 100 are connected to a supply pipe 31 and a discharge pipe 32, respectively, for the fluid 23. The fluid 23, serving as a coolant, can be supplied to the channel 9 of the channel member 100 to effectively cool the semiconductor device 21. Thus, a semiconductor unit 300 resistant to channel collapse and having high heat exchange efficiency can be provided.

If the lid part 1 of the channel member 100 is made of ceramic, the semiconductor unit 300 can be fabricated by directly forming the wiring layer 22 on the lid part 1, for example, by thick film printing, firing the wiring layer 22, and then mounting and electrically connecting the semiconductor device 21 to the wiring layer 22. This eliminates the need for an electrical insulator between the channel member 100 and the wiring layer 22, thus reducing the number of components, and also improves the cooling efficiency of the semiconductor device 21.

The semiconductor unit 300 is useful as a unit that generates a large amount of heat during operation, examples of which include car LED headlights, semiconductor modules such as PCUs, direct-current high-voltage power supply units, and switching units.

Figure 12:
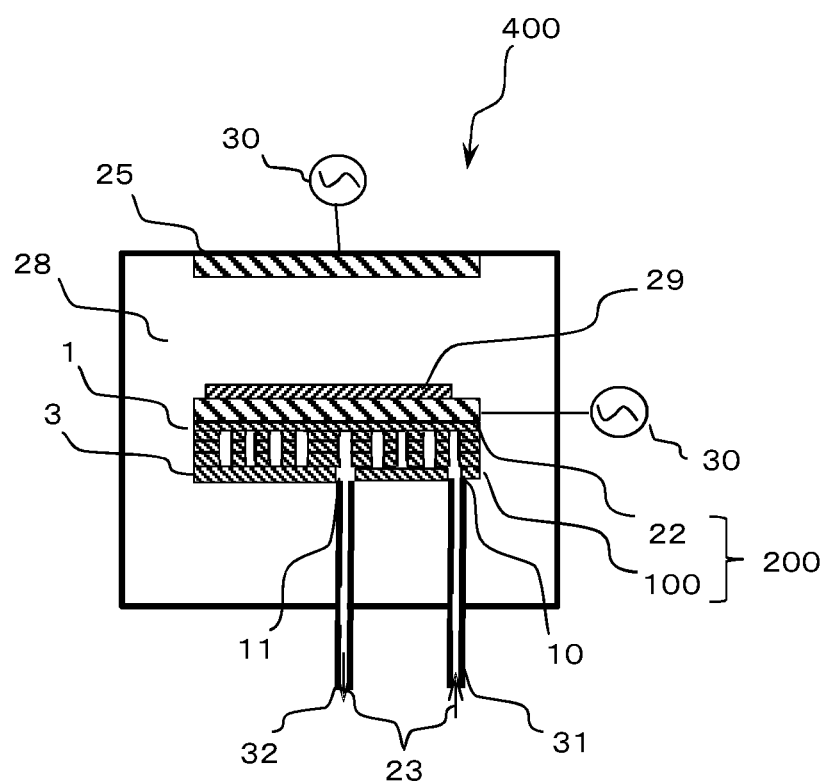
FIG. 12 is a schematic view of an example of the overall system configuration of a semiconductor manufacturing apparatus including the heat exchanger according to this embodiment.

A semiconductor manufacturing apparatus 400 according to this embodiment shown in FIG. 12 includes the heat exchanger 200 including the channel member 100 according to this embodiment and the metal member 22 bonded to the lid part 1. The metal member 22 is an electrode that attracts a semiconductor wafer 29. Although not shown, a dielectric layer made of an insulating material is disposed between the electrode 22 and the semiconductor wafer 29. As a voltage is applied to the electrode 22, electrostatic attraction, such as coulomb force or Johnson-Rahbeck force, occurs between the semiconductor wafer 29 and the dielectric layer to attract and hold the semiconductor wafer 29.

If the semiconductor manufacturing apparatus 400 is used as a plasma processing apparatus shown in FIG. 12, the metal member 22 of the heat exchanger 200 can be used as a lower electrode 22 for generating plasma. A voltage applied between the lower electrode 22 and an antenna electrode 25 disposed in the top of a processing chamber 28 generates plasma between the electrodes 22 and 25. The plasma can be applied to the semiconductor wafer 29 attracted and held on the dielectric layer. The fluid 23 can be supplied through the supply pipe 31 and the inlet 10 of the channel member 100 and can be discharged through the outlet 11 and the discharge pipe 32 to cool the lower electrode 22, which reaches high temperature during plasma processing, thereby maintaining stable temperature. Accordingly, the temperature of the wafer 29 is controlled, thus allowing processing with high dimensional accuracy. In FIG. 12, the metal member 22 of the semiconductor manufacturing apparatus 400 may be divided and used as a bipolar electrode 22 composed of two electrodes. Alternatively, the metal member 22 may be disposed in the lid part 1 of the channel member 100.

In addition to the plasma processing apparatus 24, the semiconductor manufacturing apparatus 400 according to this embodiment can be used, for example, as a sputtering apparatus, a resist coating apparatus, or a CVD apparatus. As in the plasma processing apparatus 24 described above, the metal member 22 of the heat exchanger 200 can be used as an electrode and as a table on which the semiconductor wafer 29 is placed to inhibit an excessive temperature rise in the semiconductor wafer 29. The semiconductor manufacturing apparatus 400 can also be used as an etching apparatus.

Examples of channel members according to the present invention will now be specifically described, although the present invention is not limited to these examples.

Example 1

The lid part 1, the wall part 2, and the bottom plate part 3 of the channel member 100 according to this embodiment shown in FIGS. 1(a) to 1(c) were fabricated using alumina ceramic. The channel member 100 was examined for the relationship between the cooling performance provided when the fluid 23 is supplied to the channel 9 and whether or not the channel member 100 has the gaps 7 leading to the channel 9 in the joints 6 between the lid part 1 and the wall part 2, between the bottom plate part 3 and the wall part 2, and if the wall part 2 is made of a laminate of a plurality of sheet-shaped bodies 4, between the sheet-shaped bodies 4.

The channel member 100 had an overall length L of 100 mm, a width D of 100 mm, and a height H of 50 mm. The lid part 1 had a thickness t1 of 0.5 mm. The sheet-shaped body 4 used to form a single-layer wall part 2 had a thickness t2 of 3 mm. The sheet-shaped bodies 4 used to form a three-layer wall part 2 each had a thickness t2 of 1 mm. The bottom plate part 3 had a thickness t3 of 2.5 mm. The channel 9 was spiral in plan view and had a width D1 of 4 mm. The width D2 between the channel segments 9 was 4 to 6 mm.

The inlet 10 for the fluid 23 was located in the bottom plate part 3. The spiral channel 9 was configured to allow the fluid 23 to enter the channel 9 in the periphery thereof and to exit the channel 9 through the outlet 11 in the bottom plate part 3 near the center thereof, which was the endpoint of the channel 9.

The ceramic green sheets used to form the channel member 100 were first fabricated by the following method.

An alumina ($Al_2O_3$) powder having an average particle size of about 1.6 μm and silica ($SiO_2$), calcia (CaO), and magnesia (MgO) powders were prepared.

These powders were weighed and mixed to prepare a powder mixture containing 96.4% by mass alumina, 2.3% by mass silica, 0.3% by mass calcia, and 1.0% by mass magnesia. The powder mixture was charged into a rotating mill together with polyethylene glycol as a binder in an amount of 6% by mass based on 100% by mass of the powder mixture and was mixed with high-purity alumina balls.

An acrylic resin was then added to the mixture as a binder in an amount of 4% by mass based on 100% by mass of the powder mixture and was mixed to prepare a slurry.

The resulting slurry was then applied by a known process, i.e., doctor blade coating, to form ceramic green sheets. Each ceramic green sheet was processed using a press-forming apparatus equipped with a die so as to form the product shape when laminated.

The sheet-shaped bodies 4 used to form the wall part 2 were each formed as one piece extending to the periphery thereof, including the portion adjacent to the channel 9.

Samples including a single-layer wall part 2 and samples including a multilayer wall part 2 were then fabricated, including, as shown in FIG. 7, samples having gaps 7 with no depth 7a (in practice, a depth 7a of less than 0.01 mm is assumed to be no depth 7a), samples having gaps 7 with a depth 7a, samples having gaps 7 with no maximum height 7b (in practice, a maximum height 7b of less than 0.01 mm is assumed to be no maximum height 7b), and samples having gaps 7 with a maximum height 7b. For each type of sample, 300 samples were fabricated. These are referred to as Sample Nos. 1 to 9. The dimensions of the gaps 7 in Table 1 are those measured after firing.

The gaps 7 had a triangular shape open toward the channel 9. As shown in FIG. 9, when the sheet-shaped bodies 4 used to form the wall part 2 were fabricated by forming the through-hole 5 in each ceramic green sheet 16, the chamfers 16b were formed at the end surfaces 16a of the through-hole 5 in the ceramic green sheet 16 using the press-forming apparatus 14.

The resulting ceramic green sheets 16 used to form the lid part 1, the wall part 2, and the bottom plate part 3 were laminated on top of each other. As shown in FIG. 3, the method was used in which the throwaway piece 18 cut when the through-hole 5 was formed in each ceramic green sheet 16 was fitted in the through-hole 5.

The laminated ceramic green sheets 16 were then bonded together by pressing. A bonding solution serving as an adhesive was applied in advance to the portions that were to form the joints 6. The bonding solution used was the same binder as used to fabricate the ceramic green sheets 16. The bonding solution was applied to the entire surface of each ceramic green sheet 16 to be laminated.

The ceramic green sheets 16 to which the bonding solution was applied were laminated and bonded together by pressing the top and bottom of the laminated ceramic green sheets 16 between flat plates at a pressure of about 0.5 MPa.

The resulting laminates, which had the product shape, were then fired at a maximum temperature of 1,600° C. in a pusher tunnel kiln to obtain the samples of the channel member 100 shown in Table 1.

The resulting samples were then cut to measure the depth (a) and maximum height (b) of the gaps 7 in the cross section under a factory microscope. The depth (a) and maximum height (b) of the gaps 7 are the average depth (a) and maximum height (b) of two gaps 7 near the periphery of the spiral channel 9, two gaps 7 near the center of the spiral channel 9, and two gaps 7 between the periphery and the center of the spiral channel 9, i.e., a total of six gaps 7.

Each sample was then tested by placing a heat exchange target on the lid part 1 and causing it to generate heat to determine the cooling performance ratio depending on the presence of the gaps 7 leading to the channel 9 in the joints 6 between the lid part 1 and the wall part 2 of the channel member 100, between the bottom plate part 3 and the wall part 2, and between the three sheet-shaped bodies 4 that formed the wall part 2.

Specifically, each sample was tested by attaching a heater and a thermocouple to the outer surface of the lid part 1 and heating it to a predetermined temperature.

A fluid 23 at a predetermined temperature was then supplied to the channel member 100 at a predetermined pressure.

After 30 minutes, the temperature of the outer surface of the lid part 1 was measured to determine the average temperature change in each sample.

Sample No. 1 included a single-layer wall part 2 and had no gaps 7 open in the channel 9 in the joint 6 between the lid part 1 or bottom plate part 3 and the wall part 2. The average temperature change in this sample was used as a reference, and the average temperature changes in the other samples were expressed as the ratio to the reference, which is the cooling performance ratio.

The results are shown in Table 1.

TABLE 1

| Sample No. | Structure of wall part | Gaps in joint between lid part and wall part (mm) | | | Gaps in joint between wall part and bottom plate part (mm) | | | Gaps in joints in wall part (mm) | | | Cooling performance ratio |
|---|---|---|---|---|---|---|---|---|---|---|---|
| | | Presence or Absence | Depth (a) | Maximum height (b) | Presence or Absence | Depth (a) | Maximum height (b) | Presence or Absence | Depth (a) | Maximum height (b) | |
| 1 | Single layer | Absent | — | — | Absent | — | — | — | — | — | 1 |
| 2 | Three layers | Present | 0.03 | 0.02 | Absent | — | — | Absent | — | — | 1.1 |
| 3 | Three layers | Absent | — | — | Present | 0.03 | 0.02 | Absent | — | — | 1.09 |
| 4 | Three layers | Present | 0.03 | 0.02 | Present | 0.03 | 0.02 | Absent | — | — | 1.14 |
| 5 | Three layers | Present | 0.03 | 0.02 | Present | 0.03 | 0.02 | Present | 0.02 | 0.01 | 1.16 |
| 6 | Three layers | Present | 0.03 | 0.02 | Present | 0.03 | 0.02 | Present | 0.03 | 0.02 | 1.18 |
| 7 | Three layers | Present | 0.03 | 0.02 | Present | 0.03 | 0.02 | Present | 0.03 | 0.04 | 1.19 |
| 8 | Three layers | Present | 0.03 | 0.02 | Present | 0.03 | 0.02 | Present | 0.08 | 0.06 | 1.2 |
| 9 | Three layers | Present | 0.03 | 0.02 | Present | 0.03 | 0.02 | Present | 0.09 | 0.07 | 1.22 |

As can be seen from the results shown in Table 1, Sample Nos. 2 to 9, which had the gaps 7 in any of the joints 6, had high cooling performance ratios, i.e., 1.09 to 1.22, as compared to Sample No. 1, which included a single-layer wall part 2 and had substantially no gaps 7 leading to the channel 9 between the lid part 1 and the wall part 2 or between the bottom plate part 3 and the wall part 2.

The above results demonstrate that a channel member 100 having the gaps 7 in at least one of the joint 6 between the lid part 1 and the wall part 2, the joint 6 between the wall part 2 and the bottom plate part 3, and the joints 6 in the wall part 2 has an increased contact area between the fluid 23 and the channel 9 and therefore has an increased heat transfer area therebetween, thus providing high heat exchange efficiency.

Example 2

Next, the channel member 107 shown in FIGS. 10(a) and 10(b) was examined for cooling performance ratio in the case where the barriers 8 that change the flow of the fluid 23 are provided and in the case where they are not provided.

The methods for forming and processing ceramic green sheets, the methods for laminating, bonding by pressing, and firing the ceramic green sheets, and the method for examining the samples for cooling performance ratio were the same as those in Example 1. Example 2 differs from Example 1 in that the channel member 107 had substantially no gaps 7, i.e., less than 0.01 mm, leading to the channel 9 in the joints 6 and included the barriers 8.

The necessary size and number of barriers 8 can be formed by dividing the punch 14a of the press-forming apparatus 14 for forming the through-hole 5.

The barriers 8 had a width D3 of 3 mm after firing. Sample Nos. 10 to 14, which included the barriers 8 arranged as shown in Table 2, were fabricated and examined.

The results are shown in Table 2.

TABLE 2

| Sample No. | Arrangement of barriers in wall part | | | Cooling performance ratio |
|---|---|---|---|---|
| | First layer (adjacent to lid part) | Second layer | Third layer (adjacent to bottom plate part) | |
| 10 | None | None | None | 1 |
| 11 | Arranged at intervals of 60° | None | None | 1.02 |
| 12 | None | Arranged at intervals of 60° | None | 1.16 |
| 13 | None | None | Arranged at intervals of 60° | 1.05 |
| 14 | Arranged at intervals of 60° | Arranged so as to be shifted from barriers in first layer by 20° | Arranged so as to be shifted from barriers in second layer by 20° | 1.25 |

As can be seen from the results shown in Table 2, Sample No. 14, which included the barriers 8 arranged in each sheet-shaped body 4 so as to be shifted in the order of the layers, had the highest cooling performance ratio relative to the cooling performance ratio of Sample No. 10. Sample No. 12, which included the barriers 8 arranged only in the sheet-shaped body 4 located in the middle of the wall part 2, had the second highest cooling performance ratio. Sample No. 13, which included the barriers 8 arranged in the sheet-shaped body 4 adjacent to the bottom plate part 3, had the third highest cooling performance ratio. Sample No. 11, which included the barriers 8 arranged in the sheet-shaped body 4 adjacent to the lid part 1, had the fourth highest cooling performance ratio.

The above results demonstrate that a channel member 107 including the barriers 8 that change the flow of the fluid 23 in the channel 9 provides a higher cooling performance ratio when supplied with the fluid 23 for use as a heat exchanger.

The above results also demonstrate that barriers 8 sequentially shifted in the direction in which the fluid 23 flows form a radially diffusing flow of the fluid 23 through the channel 9 that strikes the lid part 1 and thus further improve the heat exchange efficiency when a heat exchange target is mounted on the lid part 1.

REFERENCE SIGNS LIST

100 to 107 channel member
200 heat exchanger
300 semiconductor apparatus
400 semiconductor manufacturing apparatus
1 lid part
2 wall part
2*a* end surface
2*b* chamfer
2*c* burr
3 bottom plate part
4 sheet-shaped body
5 through-hole
6 joint
7 gap
7*a* depth
7*b* maximum height
8 barrier
9 channel
9*a* width
9*b* turnaround portion
9*c* central channel segment
9*d* intermediate channel segment
9*e* peripheral channel segment
10 fluid inlet
11 fluid outlet
14 press-forming apparatus
15 laser processing apparatus
16, 17 ceramic green sheet
18 throwaway piece
21 semiconductor device
22 metal member (wiring layer, lower electrode, table)
23 fluid
24 plasma processing apparatus
31 fluid supply pipe
32 fluid discharge pipe
33 recess and protrusion
33*a* maximum difference
34*a* center
34*b* periphery
35 inner wall

The invention claimed is:

1. A channel member having an inner spiral channel through which a fluid flows, the channel being formed by a lid part, a bottom plate part, and a wall part connected to the lid part and the bottom plate part, the wall part comprising a ceramic laminate of a plurality of sheet-shaped bodies, wherein the wall part has a protrusion and a recess inside a cross section of the channel perpendicular to a direction in which fluid flows which is defined by differences in the adjacent sheet-shaped bodies.

2. The channel member according to claim 1, wherein the width of the channel increases from one end toward another end in a height direction of the channel.

3. The channel member according to claim 1, wherein the width of the channel increases from the bottom plate part toward the lid part.

4. The channel member according to claim 1, wherein the width of the channel is smaller in the center of the channel than near the lid part and the bottom plate part in a height direction of the channel.

5. The channel member according to claim 1, wherein the channel comprises an inlet, an outlet, and a turnaround portion between the inlet and the outlet, a portion of the channel between the inlet and the turnaround portion being adjacent to a portion of the channel between the turnaround portion and the outlet.

6. The channel member according to claim 1, wherein the maximum difference between the protrusion and recess of the wall part that forms the channel in the center of the channel member is larger than the maximum difference between the protrusion and recess of the wall part that forms the channel in the periphery of the channel member.

7. The channel member according to claim 1, wherein the maximum difference between the protrusion and recess of the wall part that forms the channel in the outermost periphery of the channel is larger than the maximum difference between the protrusion and recess of the wall part that forms the channel in a region other than the outermost periphery of the channel.

8. The channel member according to claim 1, wherein the channel member has at least one of a gap leading to the channel between the lid part and the wall part and a gap leading to the channel between the wall part and the bottom plate part.

9. The channel member according to claim 1, wherein the laminate has a gap leading to the channel between the plurality of sheet-shaped bodies.

10. The channel member according to claim 1, wherein the channel member includes barriers that change a flow of the fluid in the channel.

11. The channel member according to claim 10, wherein the barriers are arranged so as to be sequentially shifted in a direction in which the fluid flows and in a height direction of the channel.

12. A heat exchanger comprising the channel member according to claim 1 and a metal member on or in the lid part.

13. A semiconductor unit comprising the heat exchanger according to claim 12, with the metal member on the lid part, and a semiconductor device on the metal member.

14. A semiconductor manufacturing apparatus comprising the heat exchanger according to claim 12, the metal member being an electrode that attracts a semiconductor wafer.

* * * * *